United States Patent [19]
Pauli et al.

[11] 4,075,507
[45] Feb. 21, 1978

[54] CIRCUIT ARRANGEMENT FOR EVALUATING SIGNALS, PARTICULARLY OUTPUT SIGNALS OF OPTICAL MEASURING DEVICES

[75] Inventors: Günter Pauli, Grobenzell; Gerhard Jahn, Freising, both of Germany

[73] Assignee: G.A.O. Gesellschaft fur Automation und Organisation mbH, Germany

[21] Appl. No.: 663,856

[22] Filed: Mar. 4, 1976

[30] Foreign Application Priority Data

Mar. 18, 1975 Austria ............................ 2084/75

[51] Int. Cl.² ........................................... H03K 3/42
[52] U.S. Cl. .................................. 307/117; 250/221; 307/311
[58] Field of Search ............ 307/116, 117, 311, 235 J, 307/235 T, 358, 362; 340/258 R, 258 A, 258 B, 258 C, 258 D, 248 A; 328/5; 250/221

[56] References Cited
U.S. PATENT DOCUMENTS

| 3,189,745 | 6/1965 | van Reymersdal | 307/311 X |
| 3,569,739 | 3/1971 | Stolman | 307/235 T |
| 3,676,685 | 7/1972 | Myer | 307/311 |
| 3,804,979 | 4/1974 | Knowles | 307/235 J |
| 3,863,066 | 1/1975 | Liedholz | 307/311 |

Primary Examiner—Robert K. Schaefer
Assistant Examiner—Morris Ginsburg
Attorney, Agent, or Firm—McGlew and Tuttle

[57] ABSTRACT

The circuit arrangement includes a measuring device having an output circuit connected to one input of a comparator, and including a voltage divider whose tap is connected to the other input of the comparator. A storage capacitor is connected to the tap of the voltage divider and to such other input of the comparator and provides a reference voltage bearing a fixed relation to, but always lower than, the signal voltage of the measuring device in the quiescent state of the arrangement. A bias voltage may be applied to the tap of the voltage divider. When the measuring device responds to a test object, the voltages at the comparator inputs are so switched that the reference voltage is held above the signal voltage until the measuring device returns to the quiescent state. In the quiescent state, the signal voltage exceeds the reference voltage and the comparator, changing back to the zero state, restores the initial condition of the two voltages. A switching arrangement is provided which, when the reference voltage falls below a predetermined minimum value, and if the arrangement has not switched to the operating state, provides a corresponding logic signal.

19 Claims, 13 Drawing Figures

CIRCUIT ARRANGEMENT FOR EVALUATING SIGNALS, PARTICULARLY OUTPUT SIGNALS OF OPTICAL MEASURING DEVICES

FIELD OF THE INVENTION

The present invention relates to a circuit arrangement for evaluating signals, particularly output signals of optical measuring devices, e.g. light barriers, which, by compensating and supervising variations in sensitivity, and with any signal sequence and signal duration, provides an operation signal or a quiescent signal which indicates the presence or absence of the test object and is compared with the voltage of a storage capacitor by means of a comparator.

BACKGROUND OF THE PRIOR ART

The Siemens brochures "Halbleiterbeispiele", 1964, pages 44 and 45, and 1966, pages 49 to 52, disclose circuits in which the signal provided by a photoelectric cell and amplified is compared with a fixed reference voltage by means of a Schmitt trigger or a comparator. When the signal exceeds or falls below the reference voltage, a corresponding logic signal will be produced which serves to indicate the presence or absence of the medium to be detected. These circuits have the disadvantage of also responding to signal variations not emanating from the medium to be detected, and this results in misinterpretations. Since such signal variations, caused by hum, temperature changes, component aging, contamination, supply-voltage variations, and the like, occur relatively frequently, such arrangements have a high factor of uncertainty which greatly limits the possible range of application.

Better results with respect to the drift behavior are obtained with the arrangement proposed in German Printed Application No. 2,153,910, wherein the signal voltage charges a capacitor which, together with the operational amplifier, is disconnected from the input circuit in the operating state. The voltage across this capacitor, which is approximately constant for the duration of the measuring operation, is used as the reference value. The disadvantage of this arrangement lies in the fact that the storage capacitor gradually loses its charge through leakage currents and through the load presented by the following circuit, so the measuring operation must be completed after a relatively short time. If the switching period is not foreseeable, the circuit will return to the quiescent state with the discharge of the storage capacitor although the measuring operation has not been completed yet. This results in errors, so it is advisable to use the measuring device only if exclusively short switching times are to be expected. Another disadvantage seems to be that, like in all other conventional circuits, unduly high sensitivity variations or defects in the lenses, if not noticed at the beginning, may simulate a switching state which does not exist.

SUMMARY OF THE INVENTION

It is therefore the object of the invention to provide an evaluating circuit which regardless of the signal sequence and the signal duration, provides a logic output signal indicating the respective state, with variations in sensitivity being compensated within predetermined ranges, and indicated by an additional logic signal when falling below these ranges.

In the following, for simplicity, the state in which the light barrier is cut off will be referred to as the operating state, and the state in which the light barrier is not cut off as the quiescent state of the arrangement. Accordingly, the resulting output levels will be called "operation signal" and "quiescent signal", respectively.

In accordance with the invention, the output circuit of the measuring device includes a voltage divider which, together with the output of the measuring device, is connected to one input of the comparator, while its tap is connected to the other input of the comparator, the other input of the comparator is also connected to a storage capacitor, whose voltage bears a fixable relationship to, but is always lower than, the signal voltage in the quiescent state of the measuring arrangement, that when the measuring device responds, the voltages at the comparator inputs are so switched, such as by means of a controlled switch, the reference voltage is held above the signal voltage until the measuring device returns to the quiescent state, whereupon the signal voltage exceeds the reference voltage, and the comparator, changing back to the zero state in response thereto, returns the controlled switch to the initial position, so that the original voltage conditions have been restored, and switching means are provided which, when the reference voltage falls below a predetermined minimum value, and if the arrangement has not responded, provide a corresponding logic signal.

According to an advantageous aspect of the invention, the reference voltage is checked by an additional evaluating logic, whereby inadmissible changes in the circuitry can be detected, and indicated by means of an additional logic signal.

The invention has a number of essential advantages over the prior art. For example, the independence of the signal sequence and the signal duration makes it possible to safely identify, at any time, the operational position of a measuring device, e.g. of a light barrier, a solenoid-operated switch, or the like, by means of a logic signal over protracted periods of time without having to take into account time constants of RC networks. Furthermore, the special proportioning of the extremely simple circuit permits even very small changes in input voltage to be processed with a high degree of safety. The provision of a logic supervisory signal insures that no false output signals defective light barriers are evaluated.

Further features and advantages of the invention will be apparent from the claims and from the following description of several embodiments which are adapted to meet different requirements and in which the output signal of a light barrier is to be processed.

DESCRIPTION OF THE PREFERRED EMBODIMENTS

Figure 1A:
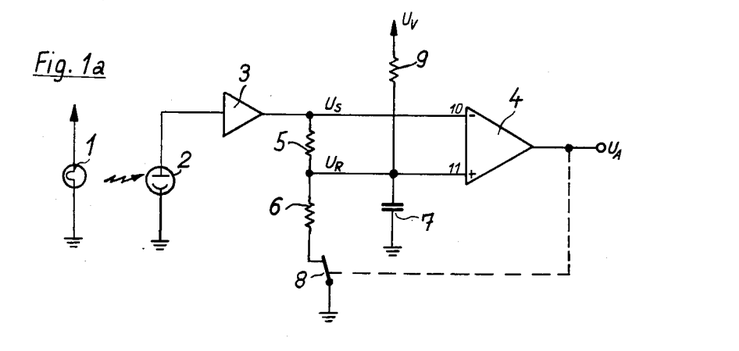
FIGS. 1a to 1c are schematic circuit diagrams of three basic embodiments of the evaluating circuit in accordance with the invention.
Figure 1B:
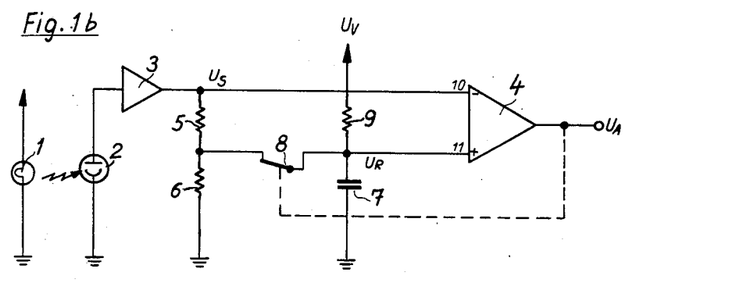
Figure 1C:
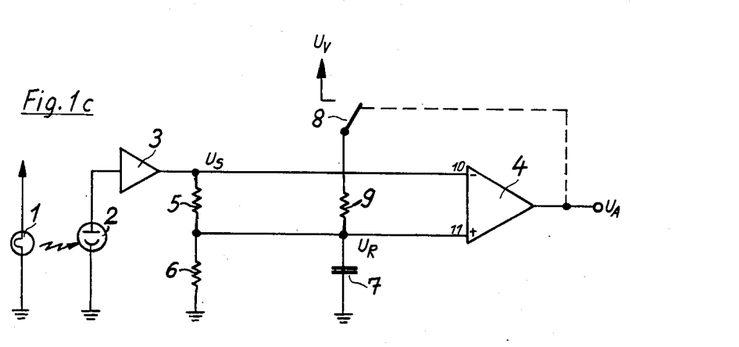

FIGS. 1a to 1c show three basic embodiments of the evaluating circuit according to the invention which differ only in that the switch 8 controlled by the comparator output is inserted in different respective branches of the circuit. The basic action principle of these three circuits is the same, however.

In FIG. 1a the level of the output signal of the photoelectric cell 2 is increased to the desired level $U_S$ in the amplifier 3 and applied to the input 10 of the comparator 4. At the same time, when the switch 8 is closed, part of this signal voltage $U_S$ is applied to the storage capacitor 7 via the voltage divider 5, 6. The voltage $U_R$ across this capacitor 7 forms the reference voltage $U_R$ at the input 11 of the comparator 4. Superimposed on this reference voltage $U_R$, through a resistor 9, is a bias voltage $U_V$ which is assumed to be larger than the signal voltage $U_S$ in the operating state and may be linearly dependent on this signal voltage, if necessary. The values of the resistors 5, 6, and 9 are assumed to be such that, when the switch 8 is closed, the reference voltage $U_R$ will not be appreciably influenced by the resistor 9 and the bias voltage $U_V$. By the term "operating state", as used above, is meant a triggered, flipped, or "on" state. It should be noted that, in the drawings, all the circuits are shown in the rest or quiescent condition.

If the radiant flux from the light source 1 to the photoelectric cell 2 is cut off or reduced, and the signal voltage $U_S$ drops below the reference voltage $U_R$, the comparator 4 will change from the zero state to the "on" state. The prerequisite for this is that the time variation of $U_S$ is faster than the discharge of the capacitor 7 through the resistors 5 and 6, which is practically always the case with normal switching operations.

In FIG. 1a the output of the comparator 4 is so connected to the controlled switch 8 at the low end of the voltage divider that, when the comparator 4 is in the "on" state (for $U_S < U_R$), its output signal $U_A$ will open the switch 8. Thus, the voltage $U_R$ is determined by the division ratio of the resistors 9 and 5 between $U_V$ and $U_S$. Because of this division ratio, $U_R$ is automatically larger than $U_S$, which prevents any unintentional return of the comparator 4 to the zero state. This state can be maintained for any length of time.

Removal of the obstruction from the light barrier is followed by an increase in the radiant flux toward the photoelectric cell 2, whereupon $U_R$, held at the previous value by the capacitor 7, is again exceeded by $U_S$. In the state $U_S > U_R$, the comparator 4 changes back to the zero state. The switch 8 is then closed again.

In FIG. 1b the switch 8 is so inserted as to be capable of disconnecting the tap of the voltage divider 5, 6 from the comparator input 11, the resistor 9, and the capacitor 7 in the operating state of the arrangement. As a result, exactly like in FIG. 1a, the bias voltage $U_V$ is no longer reduced by the grounded resistor 6 and no longer drops completely across the resistor 9. Thus, when the switch is open, the reference voltage $U_R$ is maintained at a predetermined value by the bias voltage $U_V$.

In FIG. 1c the switch 8 is closed in the operating state. It connects the resistor 9 to the bias voltage $U_V$. Since, in this variant, the value of the resistor 9 is lower than in the previously described circuits, only part of the bias voltage $U_V$ drops across the resistor 9, whereby the reference voltage $U_R$ can be stabilized in spite of the voltage divider 5, 6 being connected.

The arrangements shown in FIGS. 1a to 1c work perfectly as long as it is ensured that $U_S$ is always larger than $U_R$ after the obstruction has been removed from the light barrier. If $U_R$ has increased to an inadmissibly high value, the potential at the input terminal 11 will remain more positive than that at the terminal 10 even when the light barrier is open, whereby the comparator 4 is prevented from changing back to the zero state.

Figure 2:
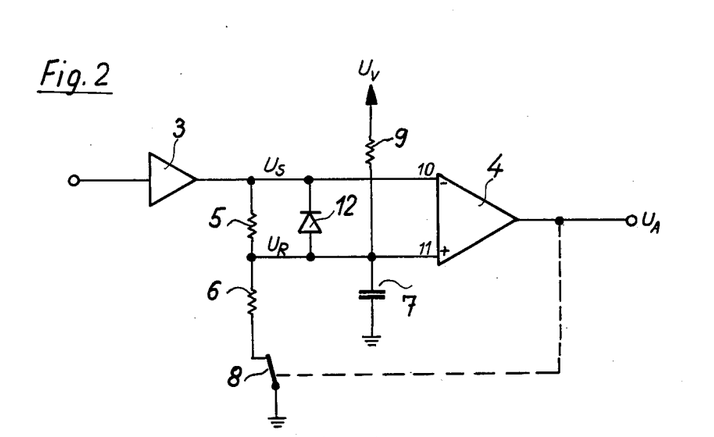
FIGS. 2 through 8 are schematic circuit diagrams illustrating improvements on the circuits shown in FIGS. 1a to 1c.

By choice of suitable resistors 9 and 5 and of a suitable constant bias $U_V$, the increase of the reference voltage $U_R$ to an inadmissibly high value can be prevented. With this circuit design, however, in the operating state of the arrangement, the difference voltage between $U_R$ and $U_S$ increases as the voltage $U_S$ decreases. This means that, when the voltage $U_S$ is small, the signal amplitude needed to switch the arrangement back will be larger than with a large voltage $U_S$. If this reciprocity between switchback sensitivity and signal amplitude is undesirable, a clamping diode 12 may be added as shown in FIG. 2, whereby the comparator-input voltage can be so limited that the signal voltage $U_S$ only has to be increased by this voltage to change the comparator to the zero state.

Figure 3:
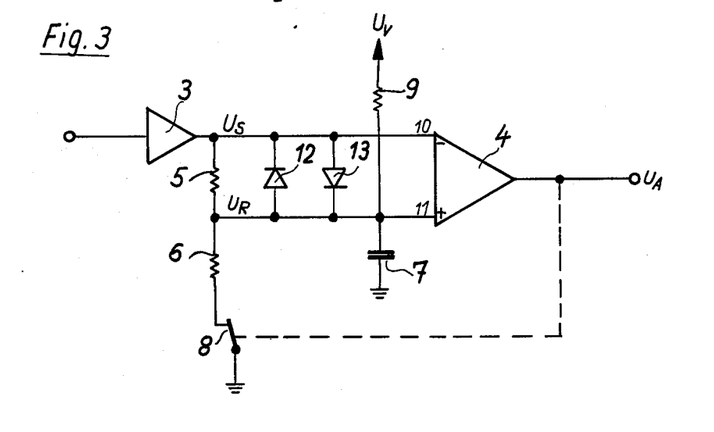

As shown in FIG. 3, a constant absolute sensitivity can be achieved for the turn-on, too, by adding a second, oppositely biased diode 13 which, in the quiescent state, limits the voltage difference to a predetermined value.

Figure 4:
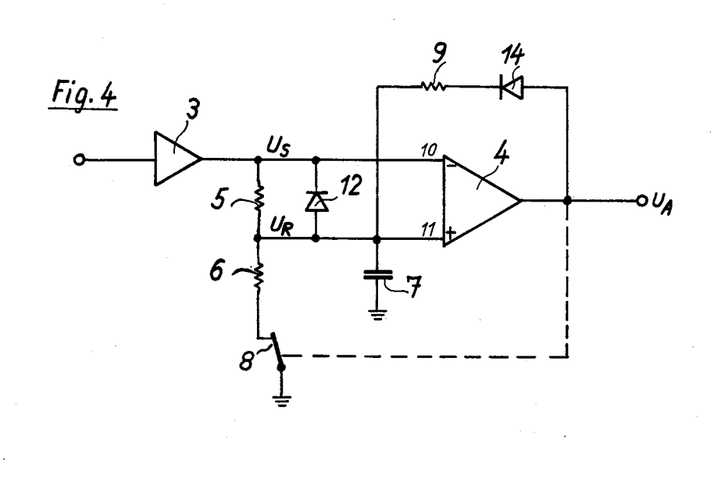

In the arrangement shown in FIG. 4, an external bias $U_V$ is dispensed with by returning the comparator output voltage $U_A$ through a diode 14 and the resistor 9 to the input terminal 11. In the quiescent state, the potential of $U_A$ is negative, whereby the diode 14 is cut off, and the feedback branch is open. This has the advantage that, when the arrangement is in the quiescent state, $U_R$ is not influenced by $U_V$. When the comparator 4 changes state, the diode 14 is rendered conductive by the now positive output voltage $U_A$, thus holding $U_R$ above $U_S$ during this state.

Since the bias $U_V$ is identical here with the comparator's output voltage $U_A$, a free choice of $U_V$ is no longer possible. This represents a certain limitation, and it will depend on the task to be accomplished which of the circuits (FIG. 3 or FIG. 4) should be preferred.

Figure 5:
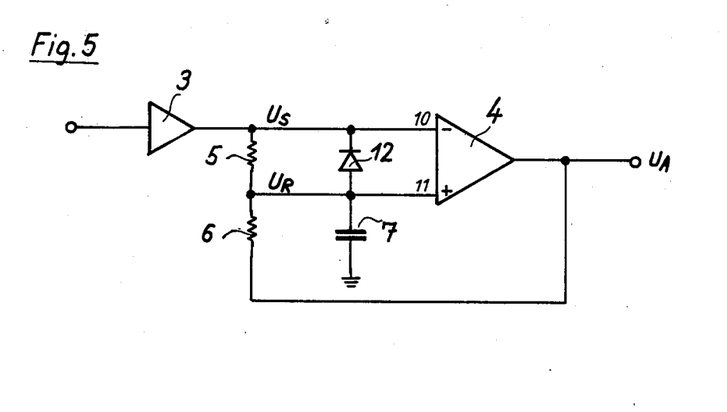

Another modification of the circuit arrangement in accordance with the invention is shown in FIG. 5, which combines the advantages of the previous embodiments and requires a minimum of components. Since in this circuit the comparator output voltage $U_A$ is used directly as the bias $U_V$, and since the comparator output voltage cannot be arbitrarily adapted to the signal voltage $U_S$ because of component values, this very simple circuit is not so universally applicable, as mentioned herein above. In this arrangement, the low end of the voltage divider 5, 6 is connected directly to the output of the comparator. The resistor 6 simultaneously performs the function of the resistor 9, with the comparator output being zero in the quiescent condition, and providing the bias $U_V$ in the operating condition.

Figure 6:
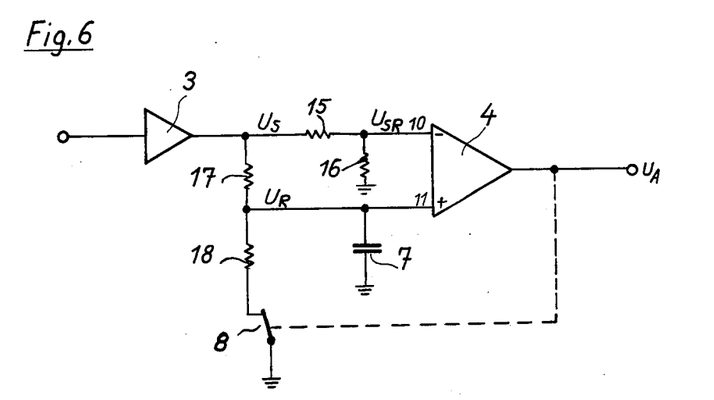

In the arrangements described so far, an as constant a difference voltage between $U_S$ and $U_R$ as possible was aimed at in connection with an as constant a bias $U_V$ as possible. To achieve a constant relative sensitivity over a wide operating range of the light barrier, however, a proportional change of the difference voltage with the signal voltage proves to be of particular advantage. The arrangement of FIG. 6 shows the basic functional relationships. The difference voltage between the inputs 10 and 11 is derived from a reduced signal voltage $U_{SR}$. When the light barrier is not interrupted, the switch 8 is closed, as in the previously described arrangements. Connected to the inputs of the comparator 4 are signal voltages reduced by means of the voltage dividers 15, 16 and 17, 18 in such a way that $U_R < U_{SR}$. If the light barrier is cut off, $U_S$ will suddenly drop to a much smaller value which is characteristic of the operating state. As a result, the reduced signal voltage $U_{SR}$ will decrease in proportion to $U_S$. Since the charged capacitor 7 prevents a decrease of the voltage $U_R$, the comparator changes to the "on" state. This opens the switch 8 and disconnects the low end of the voltage divider 17, 18. Because of the absence of the voltage divider ratio, the full input voltage $U_S$ is now applied through the resistor 17 to the capacitor 7 and hence to the comparator's input terminal 11, while only a voltage $U_{SR}$ reduced by the division ratio of the resistors 15 and 16 appears at the input terminal 10. The conditions for the "on" state, $U_{SR} < U_R$, is thus satisfied even for protracted periods of time. When the obstruction is removed from the light barrier, the voltage $U_S$ and, consequently, the reduced input voltage $U_{SR}$ will increase. The reference voltage $U_R$, which is, for a short time, kept at the previous value by the charging process of the capacitor 7, is exceeded by $U_{SR}$, whereby the arrangement switches back to the quiescent state.

Figure 7:
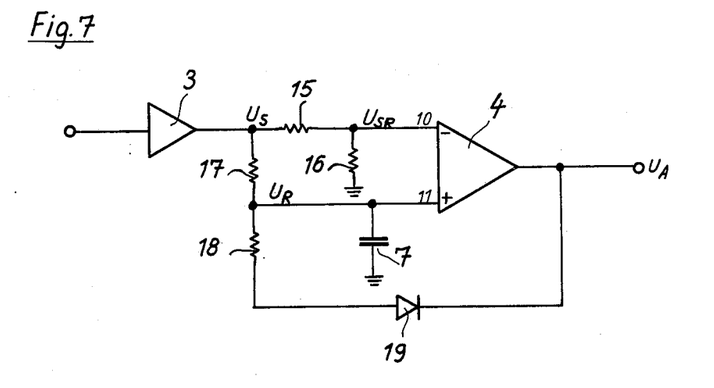

As shown in FIG. 7, the low end of the resistor 18 may be connected to the comparator output through a diode 19 which performs the function of the switch 8.

Figure 8:
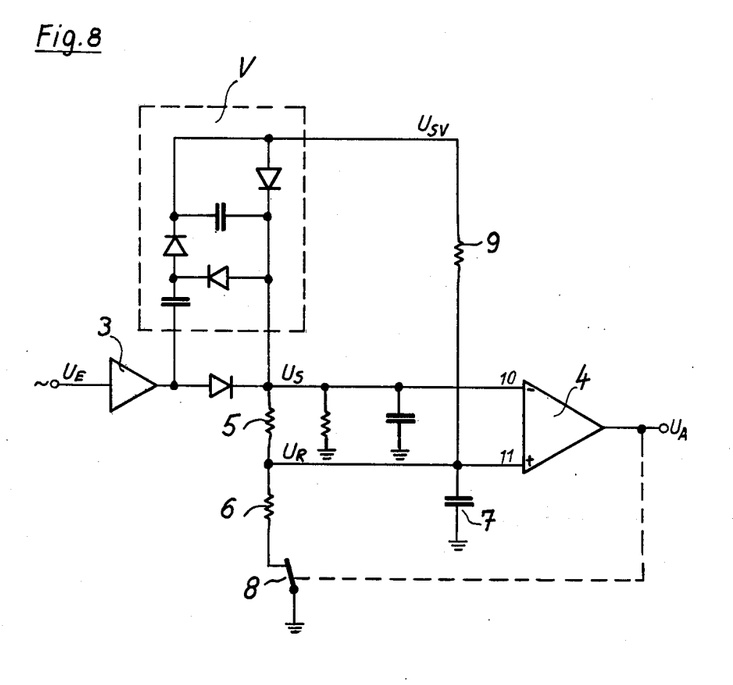

Since, as shown in FIGS. 6 and 7, the signal voltage $U_S$ is reduced to $U_{SR}$ according to the division ratio of the resistors 15 and 16, the voltage range available for signal evaluation is smaller than without division. To avoid this, the signal input voltage $U_E$, here an ac voltage, may be multiplied to a voltage $U_{SV}$ higher than the supply voltage by means of a simple multiplier V, as shown in FIG. 8. Thus, the entire permissable range of the supply voltage is available for the voltage $U_S$, while $U_V \geq U_{SV}$ is fed through the resistor 9 to the capacitor 7.

In the embodiments of FIGS. 6 to 8, the relative switch-on sensitivity and the relative switch-back sensitivity remain constant over the entire operating range of the arrangement. This property can be used to advantage in, e.g., the measurement of the absolute transmittance or reflectance of media to be examined, and in their classification.

Figure 9:
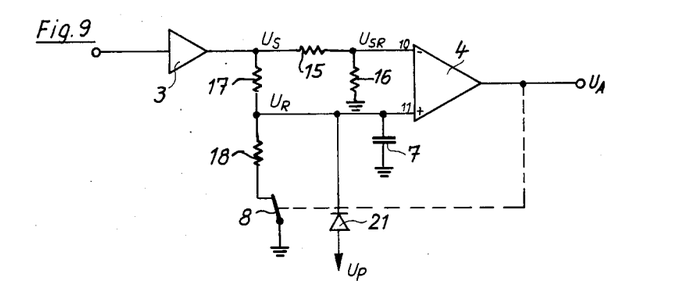
FIGS. 9 and 10 are schematic circuit diagrams illustrating the evaluating circuit with additional evaluation of the operativeness of the circuit.

If the photoelectric cell 2 is totally obscured by a switching medium, and if there is a proportional difference voltage (FIGS. 6, 7, 8), the voltage $U_S$ and hence, after a certain time, $U_R$ will decrease to the value zero. Thus, an undefined state will be obtained at the input of the comparator 4. To ensure safe operation in the "on" state even if the radiant flux toward the photoelectric cell 2 is at a minimum or totally cut off, it is therefore advantageous to fix the reference voltage $U_R$ when a minimum voltage is reached, so that this reference voltage will safely be higher than $U_S$. In FIG. 9 this is achieved in a simple manner by means of the clamping diode 21, which is cut off in the upper operating range and connected to the desired minimum voltage $U_p$. If $U_S$ drops to a value near zero, $U_R$ will be held at about 0.7 V below $U_p$ by means of the diode 21, connected to voltage $U_p$ and now conducting, whereby the states are unambiguously defined in the lowermost operating range, too.

Figure 10:
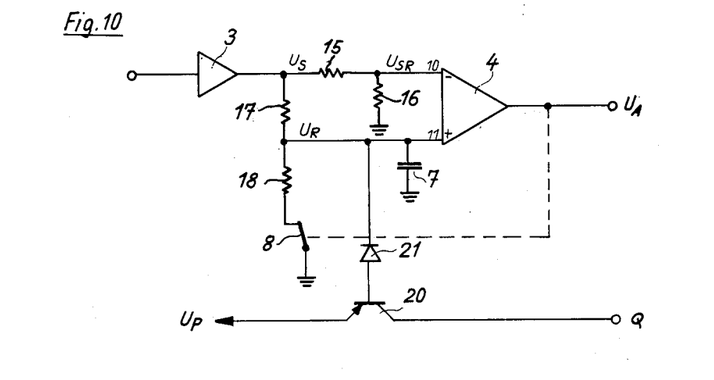

To additionally supervise the operativeness of the arrangement, the clamping diode 21 is connected to the base of a transistor 20 having its emitter connected to the voltage $U_p$, as shown in FIG. 10. When the minimum voltage $U_R$ is reached, the transistor 20 will turn on and can provide a logic signal Q which is suitable for further processing. At the same time, $U_R$ is held at $U_p - U_{EBT} - U_{DH}$ ($U_{EBT}$ = emitter-to-base voltage, $U_{DH}$ = voltage drop across the clamping diode).

To be able to determine unambiguously whether or not the system is operative, the logic signal Q should be evaluated only when the comparator is in the zero state. This can be accomplished by a suitable logic operation when the following states have occurred as a criterion of the system's operativeness:

1. $U_R > U_P$ (20 open) irrespective of the comparator output signal.
2. UR was greater than $U_P$ prior to the comparator's change to the "on" state, and 20 turns on ($U_R$ becomes smaller than $U_P$) following this change.

Inoperativeness will be indicated if

1. $U_R < U_P$ with the comparator in the zero state;
2. $U_R$ was smaller than $U_P$ before the comparator changed to the "on" state, and if the comparator is in the "on" state.

The states can be stored in a flip-flop.

Figure 11:
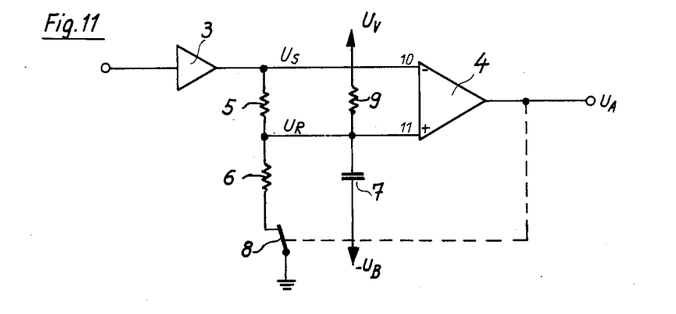
FIGS. 11 is a schematic circuit diagram illustrating a variant insuring that the arrangement is in the correct state after having been put into operation.

Difficulties may arise if the arrangement does not change to a defined state when the operating voltage is turned on. According to the invention, these difficulties are avoided by an arrangement as shown in FIG. 11, where the storage capacitor 7 is connected to a suitable operating voltage $-U_B$, so when the operating voltage is turned on, the arrangement will change to the quiescent state.

What is claimed is:

1. A circuit arrangement for evaluating signals, particularly output signals of optical measuring devices, such as light barriers, for example, which, by compensating and supervising variations in sensitivity, and with any signal sequence and signal duration, provides an operation signal or a quiescent signal which indicates the presence or absence of the test object and is compared with the voltage of a storage capacitor by means of a comparator, said circuit arrangement comprising, in combination, a measuring device having an output circuit; a voltage divider included in said output circuit; means connecting said output circuit and one end of said voltage divider to one input of said comparator; means connecting the tap of said voltage divider to the other input of said comparator; a storage capacitor connected to said other comparator input and providing a reference voltage ($U_R$) bearing a fixed relation to, but always lower than, the signal voltage ($U_S$) of said measuring device in the quiescent state of said arrangement; and means operable, with said measuring device responding to a test object, to so switch the voltages at said comparator inputs that said reference voltage ($U_R$) is held above said signal voltage ($U_S$) until said measuring device returns to its quiescent state; said signal voltage ($U_S$) exceeding said reference voltage ($U_R$) in such quiescent state and said comparator, changing back to the zero state in response thereto, causes said means operable to switch the voltages at said comparator inputs to return the voltages to the initial conditions.

2. A circuit arrangement according claims 1, characterized in that the switching of the comparator input voltages is controlled by the comparator output signal.

3. A circuit arrangement according to claim 1 in which, in the operating state of the arrangement, a bias voltage is impressed on the reference voltage.

4. A circuit arrangement according to claim 1, in which, in the operating state of the arrangement, an external bias voltage is impressed on the reference voltage.

5. A circuit arrangement according to claim 4, including a resistor connected to the side of said capacitor connected to the tap of said voltage divider, and connected to said external bias voltage; the values of said resistor and said bias voltage being chosen so that, in the operating state of said circuit arrangement, said reference voltage is larger than said signal voltage and, when the circuit arrangement switches back to the quiescent state, said reference voltage can be exceeded by said signal voltage.

6. A circuit arrangement according to claim 1, in which, in the operating state of the arrangement, the comparator output voltage is impressed on the reference voltage.

7. A circuit arrangement according to claim 6, in which said capacitor is connected to the output of said comparator through a resistor and a diode which is so biased that, in the operating state of the arrangement, the output voltage of the comparator is applied to said capacitor.

8. A circuit arrangement according to claim 1, in which said capacitor is so connected to the supply voltage that said comparator will change to a defined state when the supply voltage is turned on.

9. A circuit arrangement, according to claim 1, in which said means operable to switch the voltages at said comparator inputs comprises a switch controlled by the output of said comparator.

10. A circuit arrangement according to claim 9, in which, in the operating state, the voltage divider is disconnected from ground potential at its low end by means of said switch.

11. A circuit arrangement according to claim 9, including a resistor connecting a source of bias potential to the tap of said voltage divider; said switch, in the operating state of said circuit arrangement, disconnecting said resistor, said capacitor and said other comparator input from the tap of said voltage divider.

12. A circuit arrangement according to claim 9, including a resistor connected to the tap of said voltage divider; said switch, in the operating state of said circuit arrangement, connecting said resistor to a source of bias voltage.

13. A circuit arrangement according to claim 1, including at least one diode connected between said comparator inputs and so biased that, in the operating state of said measuring device, the voltage difference between said signal voltage and said reference voltage is limited to a desired maximum value.

14. A circuit arrangement according to claim 13, including at least one other diode connected between said comparator inputs and biased opposite to said at least one diode, so as to limit the voltage difference between said signal voltage and said reference voltage to a desired maximum value in the operating state of said circuit arrangement.

15. A circuit arrangement according to claim 1, including a second voltage divider connected in parallel with the first mentioned voltage divider; said one input of said comparator being connected to the tap of said second voltage divider; said two voltage dividers being so designed that, in the operating state, said reference voltage is greater than the voltage at the tap of said second voltage divider.

16. A circuit arrangement according to claim 1, including a voltage multiplier in the output circuit of said measuring device, and means applying the multiplied voltage as the bias voltage to said capacitor.

17. A circuit arrangement according to claim 1, including a diode having one terminal connected to said other comparator input and its other terminal connected to a source of voltage limiting said reference voltage to a minimum value.

18. A circuit arrangement according to claim 17, including a transistor having its base connected to said other terminal of said diode; and means applying said limiting voltage to the emitter of said transistor; the state of said transistor being so linked to the output signal of said comparator that an unambiguous logic signal will be produced at the collector of said transistor only when said minimum value has been reached and said comparator is in the zero state, said logic signal being also produced later when said comparator is in the "on" state.

19. A circuit arrangement according to claim 1, in which said voltage divider has one terminal connecting to said one input of said comparator; and a diode connected the other terminal of said voltage divider to the output of said comparator and operable to cut off the current flow through said voltage divider when said comparator is in the "on" state.

* * * * *